(12) United States Patent
Xiang et al.

(10) Patent No.: US 7,211,489 B1
(45) Date of Patent: May 1, 2007

(54) LOCALIZED HALO IMPLANT REGION FORMED USING TILT PRE-AMORPHIZATION IMPLANT AND LASER THERMAL ANNEAL

(75) Inventors: Qi Xiang, San Jose, CA (US); Robert B. Ogle, San Jose, CA (US); Eric N. Paton, Morgan Hill, CA (US); Cyrus E. Tabery, Santa Clar, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/934,378

(22) Filed: Sep. 7, 2004

(51) Int. Cl.
*H01L 21/336* (2006.01)
(52) U.S. Cl. ................... 438/300; 257/310
(58) Field of Classification Search ............... None
See application file for complete search history.

(56) References Cited

U.S. PATENT DOCUMENTS

| | | | |
|---|---|---|---|
| 5,930,615 A | 7/1999 | Manning | |
| 5,953,615 A | 9/1999 | Yu | |
| 6,180,476 B1 | 1/2001 | Yu | |
| 6,194,278 B1 | 2/2001 | Rengarajan | |
| 6,232,166 B1 | 5/2001 | Ju et al. | |
| 6,291,302 B1 | 9/2001 | Yu | |
| 6,294,432 B1 | 9/2001 | Lin et al. | |
| 6,403,433 B1 * | 6/2002 | Yu et al. | 438/300 |
| 6,432,763 B1 * | 8/2002 | Yu | 438/217 |
| 6,472,282 B1 * | 10/2002 | Yu | 438/305 |
| 6,482,724 B1 * | 11/2002 | Chatterjee | 438/525 |
| 6,642,122 B1 * | 11/2003 | Yu | 438/372 |
| 6,677,212 B1 * | 1/2004 | Yoshioka et al. | 438/303 |
| 6,747,325 B2 * | 6/2004 | Shih | 257/408 |
| 6,924,216 B2 * | 8/2005 | Feudel et al. | 438/525 |
| 2002/0086502 A1 * | 7/2002 | Liu et al. | 438/530 |
| 2004/0087120 A1 * | 5/2004 | Feudel et al. | 438/525 |
| 2005/0112830 A1 * | 5/2005 | Jain et al. | 438/301 |

* cited by examiner

*Primary Examiner*—Michael Lebentritt
*Assistant Examiner*—Andre' Stevenson

(57) ABSTRACT

The present invention enables the production of improved high-reliability, high-density semiconductor devices. The present invention provides the high-density semiconductor devices by decreasing the size of semiconductor device structures, such as gate channel lengths. Short-channel effects are prevented by the use of highly localized halo implant regions formed in the device channel. Highly localized halo implant regions are formed by a tilt pre-amorphization implant and a laser thermal anneal of the halo implant region.

19 Claims, 7 Drawing Sheets

LOCALIZED HALO IMPLANT REGION FORMED USING TILT PRE-AMORPHIZATION IMPLANT AND LASER THERMAL ANNEAL

FIELD OF THE INVENTION

The present invention relates to the manufacturing of semiconductor devices, and more particularly, to forming semiconductor devices with halo implant regions.

BACKGROUND OF THE INVENTION

An important aim of ongoing research in the semiconductor industry is increasing semiconductor performance while decreasing power consumption in semiconductor devices. Planar transistors, such as metal oxide semiconductor field effect transistors (MOSFET) are particularly well suited for use in high-density integrated circuits. As the size of MOSFET and other devices decrease, the dimensions of source/drain regions, channel regions, and the gate electrodes of the devices, also decrease.

As the channel length decreases, short-channel effects increase. Short-channel effects include punchthrough and decreased threshold voltage at the gate edge in the off state ($V_T$).

Halo implants eliminate short-channel effects by increasing $V_T$ at the gate edge and repeats eliminating punchthrough. Halo implants (also called pocket implants) are ring-shaped implants formed in the channel region, adjacent the source/drain regions. Halo implant regions are formed with a conductivity type opposite that of the source/drain regions. Halo implant regions prevent merger of the source/drain regions in the channel region. The halo implant regions provide an abrupt transition between the source/drain extensions and the channel region. Typically, halo implant regions have a lower concentration of dopant than the source/drain extensions.

One shortcoming of conventional halo implants is the difficulty in precisely controlling the location and boundaries of the halo implant region. As devices become smaller and channel lengths decrease, the location and the boundaries of the halo implant regions becomes more critical.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising semiconductors.

SUMMARY OF THE INVENTION

There exists a need in the semiconductor device art for a semiconductor device with highly localized halo implant regions. There exists a need in this art for a method of forming a semiconductor device with highly localized halo implant regions. There further exists a need in this art for a method of producing high-reliability semiconductor devices with shorter channel lengths to allow the production of higher-density integrated circuits.

These needs are met by a method of forming a semiconductor comprising providing a silicon-containing semiconductor substrate with source/drain regions formed therein. A channel region is formed between the source and drain regions and a gate electrode structure is formed over the channel region of the semiconductor substrate. An electrically neutral dopant is implanted into a region of the silicon-containing substrate adjacent the boundary of the source and drain regions and the channel region to form an amorphized region. A dopant of a first conductivity type is implanted into the amorphized region and a portion of the amorphized region is activated.

This invention addresses a need for an improved high-reliability, short channel length semiconductor device comprising highly localized halo implant regions.

The foregoing and other features, aspects, and advantages of the present invention will become apparent in the following detailed description of the present invention when taken in conjunction with the accompanying drawings.

BRIEF DESCRIPTION OF THE DRAWINGS

The following detailed description of the embodiments of the present invention are best understood when read in conjunction with the following drawings, in which the various features are not necessarily drawn to scale, but rather, are drawn as to best illustrate the pertinent features. Like references numerals are employed throughout to designate similar features.

DETAILED DESCRIPTION OF THE INVENTION

Figure 1:
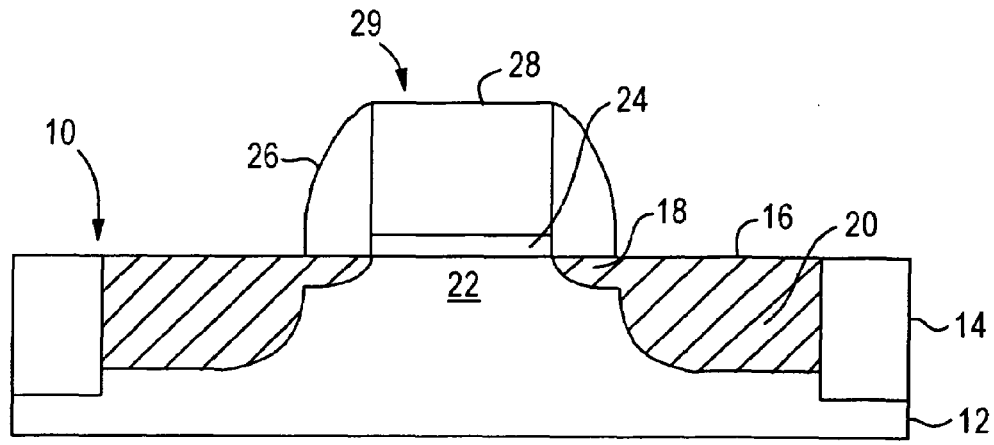
FIGS. 1–12 schematically illustrate a method of forming a semiconductor device comprising a halo implant region according to an embodiment of the invention.

The present invention enables the production of high-reliability semiconductor devices with short channel lengths. The present invention allows the production of high-reliability, high-density integrated circuits. The present invention prevents short-channel effects, such as punchthrough and decreased $V_T$. The present invention provides a method of forming short channel length semiconductor devices with highly localized halo implant regions.

The invention will be described in conjunction with the formation of the semiconductor device illustrated in the accompanying drawings. However, this is exemplary only as the claimed invention is not limited to the formation of the specific devices illustrated in the drawings.

Figure 10:
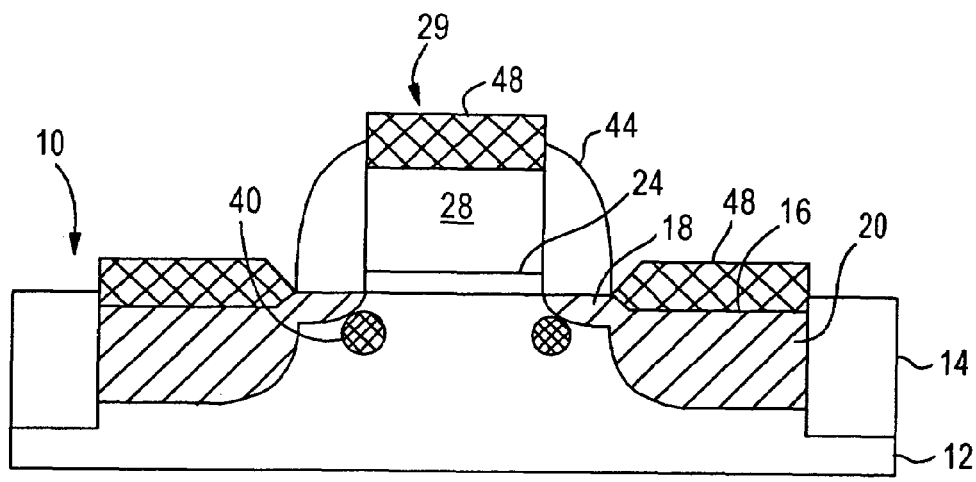

A semiconductor device 10 is formed via the following steps in accordance with certain embodiments of the instant invention. The semiconductor device 10 illustrated in FIG. 10 is a MOSFET. The MOSFET 10 comprises a semiconductor substrate 12, such as a silicon-containing wafer. The MOSFET 10 is isolated from other devices by isolation regions 14. The isolation regions 14 can be formed by known methods, including local oxidation of silicon (LOCOS), or shallow trench isolation (STI). In the instant embodiment, the isolation region 14 is formed by an STI method. Source/drain regions 16 comprising source/drain extensions 18 and heavily doped regions 20 are formed surrounding a channel region 22 by conventional methods, such as ion implantation.

A gate electrode structure 29 comprising gate electrode 28 and gate oxide layer 24 is formed over the channel region 22 according to conventional methods. Conventional methods of forming the gate electrode structure 29 include formation of a gate oxide layer 24, such as by thermal oxidation of a portion of the silicon-containing substrate 12 or by chemical vapor deposition (CVD), deposition of a polysilicon electrode layer 28, and photolithographic patterning of the deposited gate oxide layer 24 and gate electrode layer 28. The gate oxide layer 24 is typically formed to a thickness of about 10 Å to about 100 Å. The gate electrode layer 28 is typically formed to a thickness of about 100 nm to about 300 nm. Sidewall spacers 26 are formed surrounding the gate electrode structure 29 by conventional methods, such as deposition of layer of insulating material, including silicon nitride or silicon oxide, followed by anisotropic etching to form the sidewalls 26.

The source/drain regions 16 are formed by conventional techniques, such as ion implantation and thermal annealing to activate the implanted source/drain regions. The type dopant implanted into the source/drain regions 16 depends on whether the device is a N-type MOSFET (NMOSFET) or a P-type (PMOSFET) transistor. For example, if the transistor is a NMOSFET, a N-type dopant is implanted into the source/drain regions 16. In certain embodiments of the instant invention, a N-type dopant, such as arsenic (As) is implanted into the source/drain extensions 18 at an implantation dosage of about $1 \times 10^{14}$ ions/cm$^2$ to about $1 \times 10^{15}$ ions/cm$^2$ and an implantation energy of about 2 keV to about 5 keV. The As is implanted into the heavily doped regions 20 at an implantation dosage of about $1 \times 10^{15}$ ions/cm$^2$ to about $4 \times 10^5$ ions/cm$^2$ and an implantation energy of about 20 keV to about 50 keV.

If the transistor is a PMOSFET, a P-type dopant is implanted into the source/drain regions 16. In certain embodiments of the instant invention, a P-type dopant, such as boron difluoride (BF$_2$) is implanted into the source/drain extensions 18 at an implantation dosage of about $1 \times 10^{14}$ ions/cm$^2$ to about $1 \times 10^{15}$ ions/cm$^2$ and an implantation energy of about 2 keV to about 5 keV. In certain embodiments of the instant invention, boron (B) is implanted into the heavily doped regions 20 at an implantation dosage of about $1 \times 10^{15}$ ions/cm$^2$ to $4 \times 10^{15}$ ions/cm$^2$ and an implantation energy of about 2 keV to about 10 keV.

Figure 2:
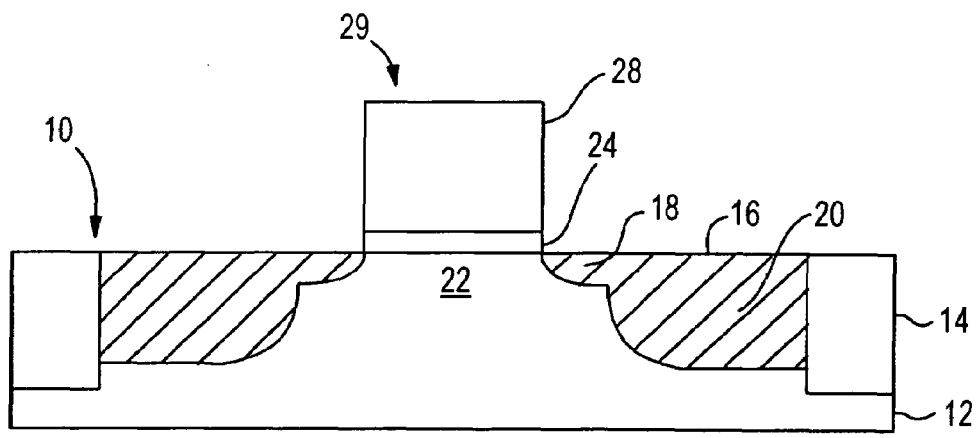
Figure 3:
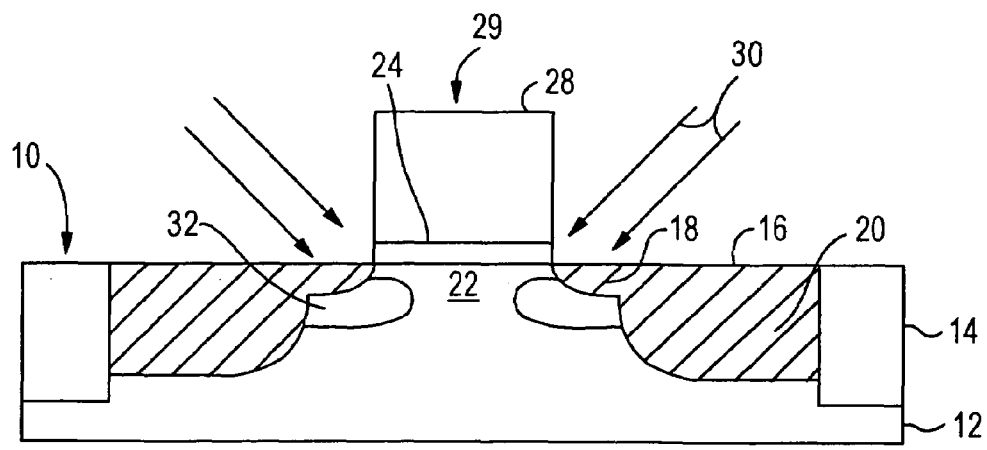

In certain embodiments of the instant invention, sidewall spacers 26 are removed from the semiconductor device, as illustrated in FIG. 2, before forming halo implant regions. The sidewall spacers 26 can be removed by an appropriate etching technique. For example, if the sidewall spacers 26 comprise silicon nitride, the sidewall spacers 26 can be selectively removed by etching with hot phosphoric acid. As illustrated in FIG. 3, an electrically neutral dopant 30 is implanted into the channel region 22 to form amorphous regions 32. The implantation of the electrically neutral dopant, commonly termed a pre-amorphization implant (PAI), disrupts the crystal structure in a portion of the channel region 22 to form localized amorphous regions 32. In order to form the amorphous regions 32 under the gate electrode structure 29, a tilt implant is employed. In certain embodiments of the instant invention, the electrically neutral dopant is tilt implanted into the semiconductor device at an angle of about 15° to about 45° to a vertical axis. In certain embodiments of the instant invention, a plurality of tilt implant steps directed from opposing sides of the gate electrode structure 29 are performed to produce an amorphous region 32 surrounding the channel region 22. In certain alternative embodiments of the instant invention, the amorphous region 32 can be formed surrounding the channel region 22 by the use of rotary implantation.

The electrically neutral dopant is selected from known electrically neutral dopants, such as silicon (Si), germanium (Ge), argon (Ar), and Xenon (Xe). The electrically neutral dopant is implanted at an implantation dosage of about $1 \times 10^{14}$ ions/cm$^2$ to about $1 \times 10^{16}$ ions/cm$^2$ and an implantation energy of about 1 keV to about 100 keV.

Figure 4:
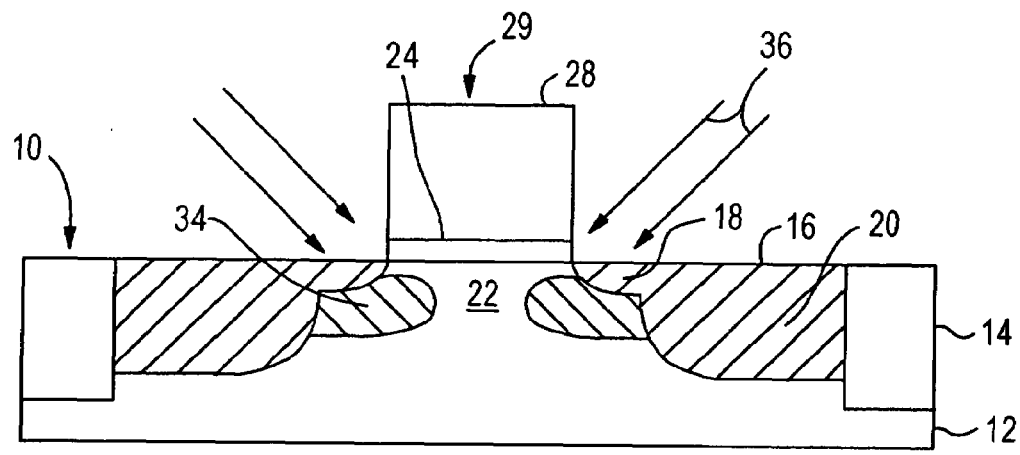

Dopant of an opposite conductivity type to that which is implanted into the source/drain regions 16 is subsequently implanted into the amorphous regions 32 to form halo implant regions 34, as illustrated in FIG. 4. In certain embodiments of the instant invention where the semiconductor device is a NMOSFET, the dopant 36 implanted into the amorphous regions 32 is a P-type dopant, such as a boron. On the other hand, if the semiconductor device is a PMOSFET the dopant 36 implanted into the amorphous regions 32 is a N-type dopant, such as arsenic.

The implantation step to form the halo implant region 34 is performed in a similar manner as the electrically neutral dopant implant. For example, the halo region dopant 36 is implanted at about the same angle as the electrically neutral dopant 30 by either implanting in a plurality of steps from opposing sides of the gate electrode structure 29 or by rotary implantation. In certain embodiments of the instant invention, boron is implanted into the amorphized region 32 of a NMOSFET at an implantation dosage of about $8 \times 10^{12}$ ions/cm$^2$ to about $5 \times 10^{13}$ ions/cm$^2$ and an implantation energy of about 7 keV to about 15 keV. In certain embodiments of the instant invention, arsenic is implanted into the amorphized region 32 of a PMOSFET at an implantation dosage of about $8 \times 10^{12}$ ions/cm$^2$ to about $5 \times 10^{13}$ ions/cm$^2$ and an implantation energy of about 30 keV to about 50 keV.

Figure 5:
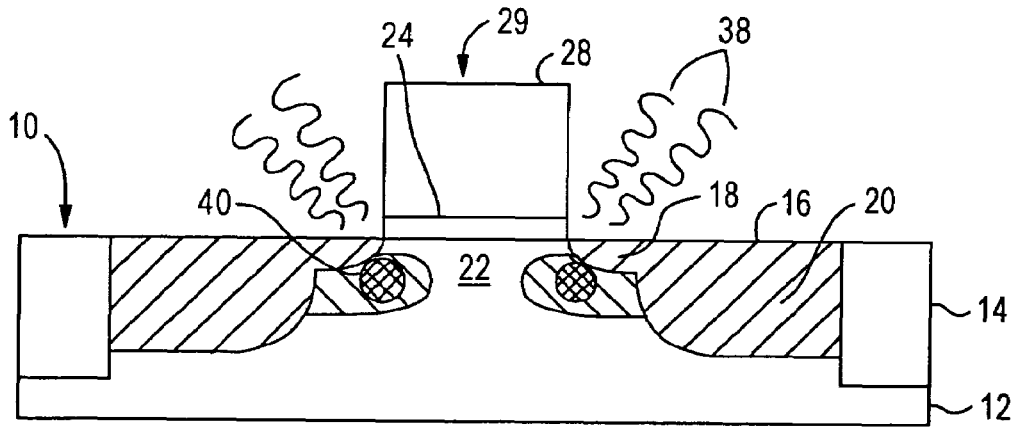

Portions of the amorphous halo implant regions 34 are recrystallized, such as by a laser thermal anneal (LTA). LTA provides highly localized heating at portions of the halo implant region 34 to cause the portions of the halo implant region 34 to melt and recrystallize to form activated halo implant regions 40. The highly localized heating of the halo implant regions 34 by LTA limits the dimensions of the recrystallized region 40 and allows the formation of a ring-shaped activated halo implant region 40. As shown in FIG. 5, the laser beams 38 are directed towards the halo implant regions 40 at about the same angle as the dopant implants. A suitable laser for performing the LTA step has a wavelength of about 150 nm to about 310 nm, and a laser fluence of about 0.1 J/cm$^2$ to about 1.5 J/cm$^2$.

Figure 6:
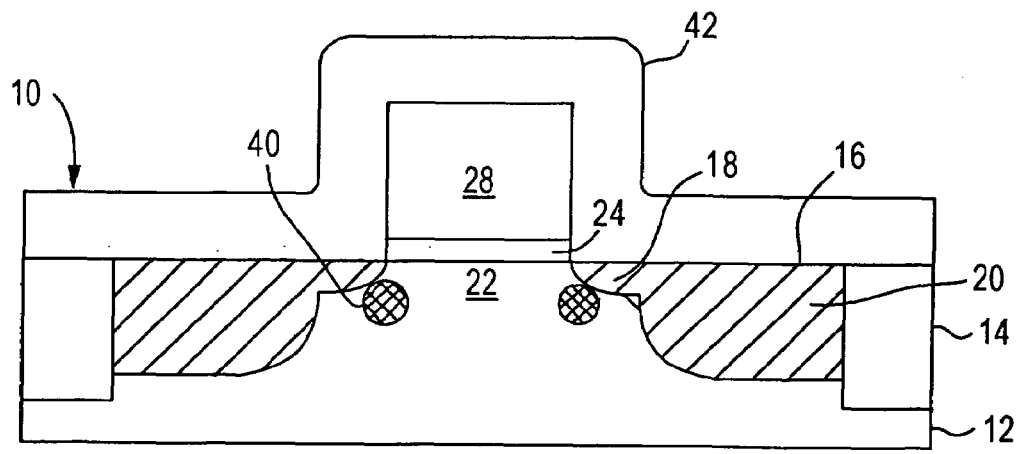
Figure 7:
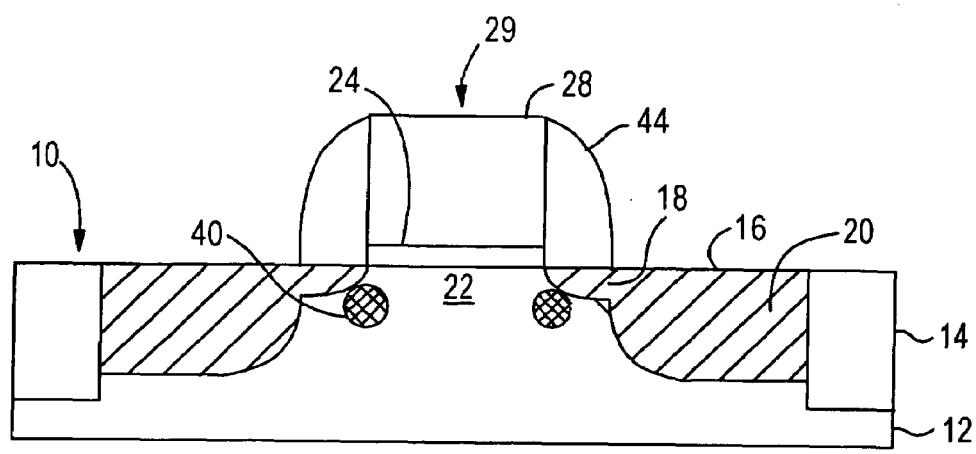
Figure 8:
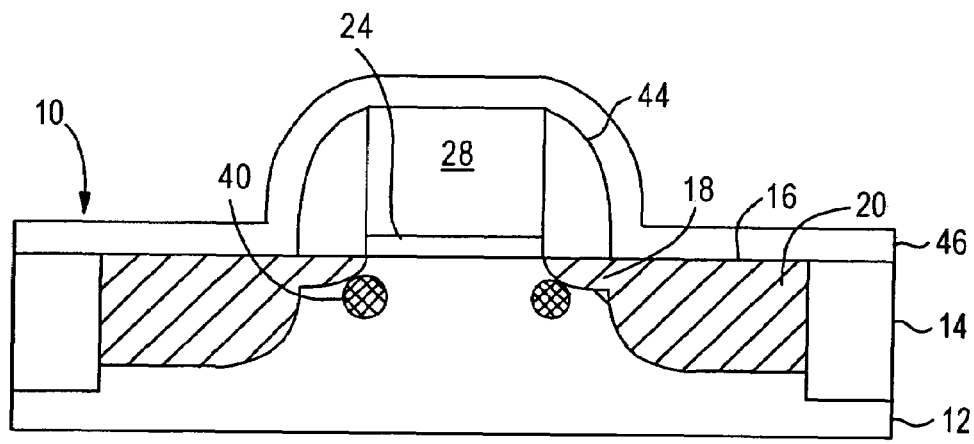

An insulating layer 42 is deposited over the semiconductor device 10 such as by CVD, as shown in FIG. 6. In FIG. 6, and subsequent Figures of this embodiment, only the activated portion of the halo implant region 40 is illustrated. Insulating layer 42 can comprise either silicon oxide or silicon nitride, for example, or other suitable materials. The insulating layer 42 is subsequently anisotropically etched to form gate sidewalls 44, as shown in FIG. 7.

A metal layer 46 is deposited over the semiconductor device 10 by conventional means, such as CVD or a physical deposition, such as sputtering. The metal layer 46 will be used to form metal silicide contacts 48 and can be any of the metals conventionally used in forming metal silicide contacts, such as cobalt (Co), tantalum (Ta), nickel (Ni), tungsten (W), titanium (Ti), molybdenum (Mo), chromium (Cr), platinum (Pt), and palladium (Pd).

Figure 9:
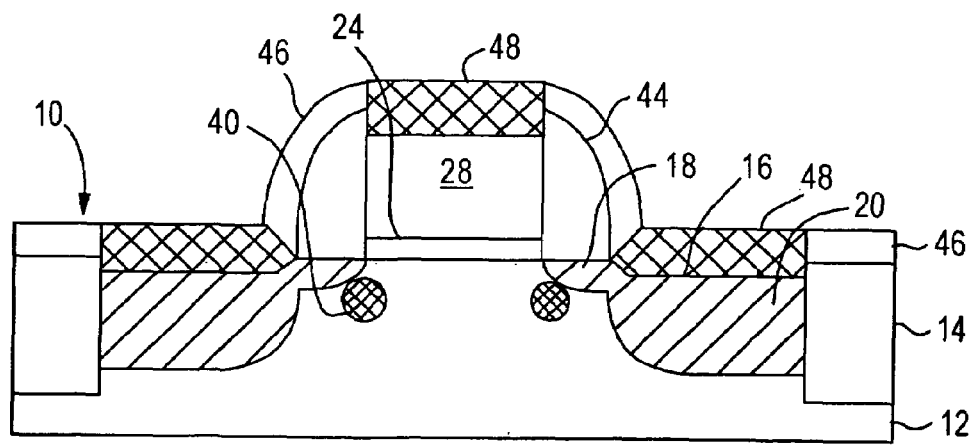

As shown in FIG. 9, semiconductor device 10 is heated to a temperature sufficient to allow the metal layer 46 to react with silicon in the source/drain regions 16 and the gate electrode 28 to form metal silicide contacts 48. The temperature and time required to enable the metal layer 46 to sufficiently react and form silicide layers 48 are dependent upon the type of metal used in metal layer 46. The heating profiles for forming metal silicides from conventionally used metals are known in the art. The unreacted metal 46 is subsequently removed from the semiconductor device 10 as shown in FIG. 10. Conventional metal removal techniques can be used, such as selective etching using etchants appropriate for the type of metal to be removed.

Figure 11:
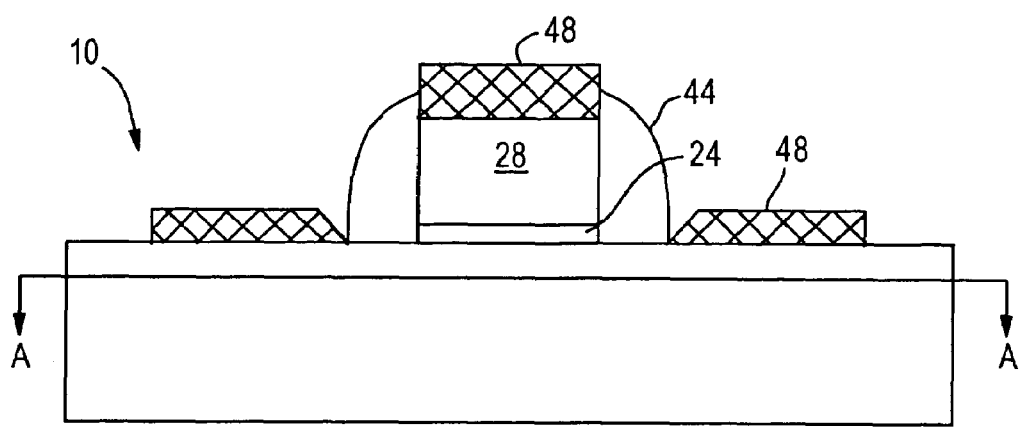
Figure 12:
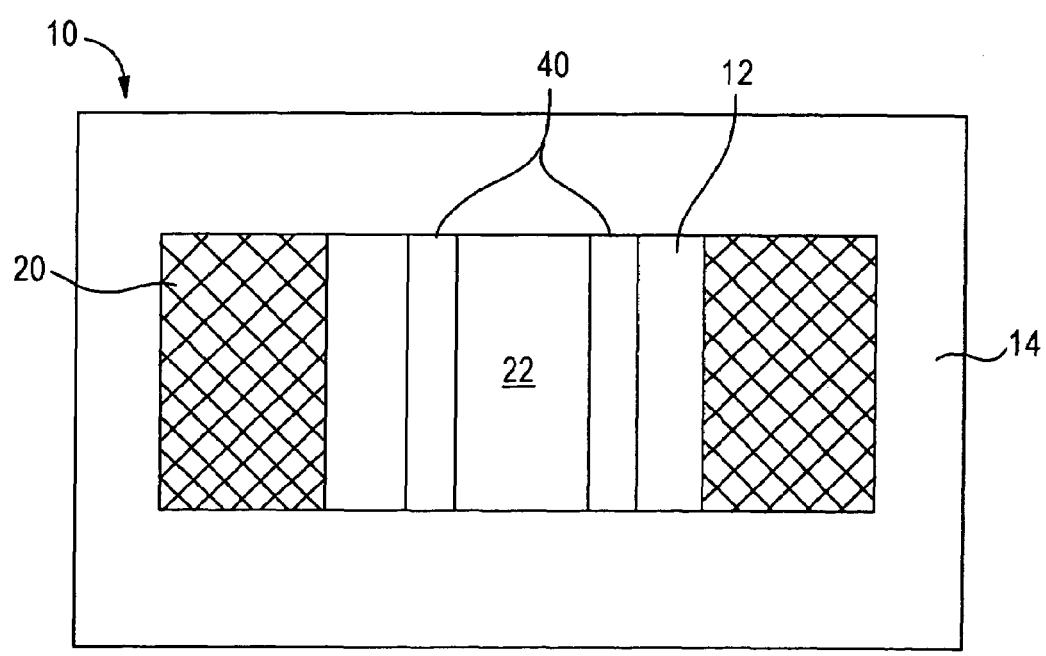

FIG. 11 is an edge view of the semiconductor device formed in FIG. 10. A section taken along line AA shows the activated halo implant region 40 surrounding the channel region 22.

Figure 13:
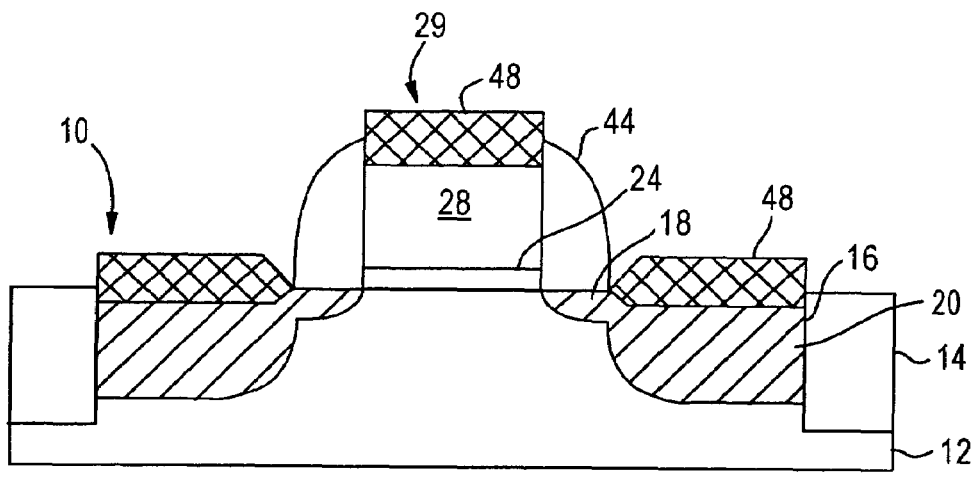
FIGS. 13–18 schematically illustrate a method of forming a semiconductor device comprising a halo implant region according to another embodiment of the invention.
Figure 14:
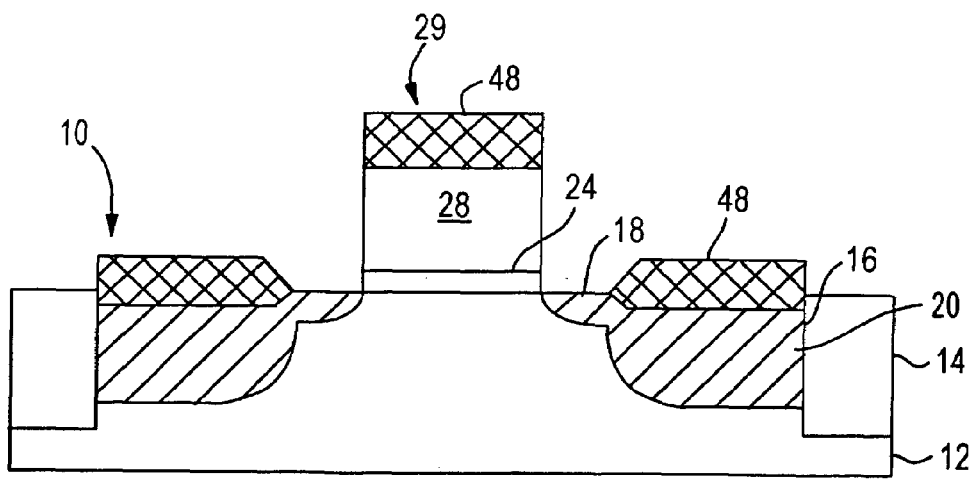
Figure 15:
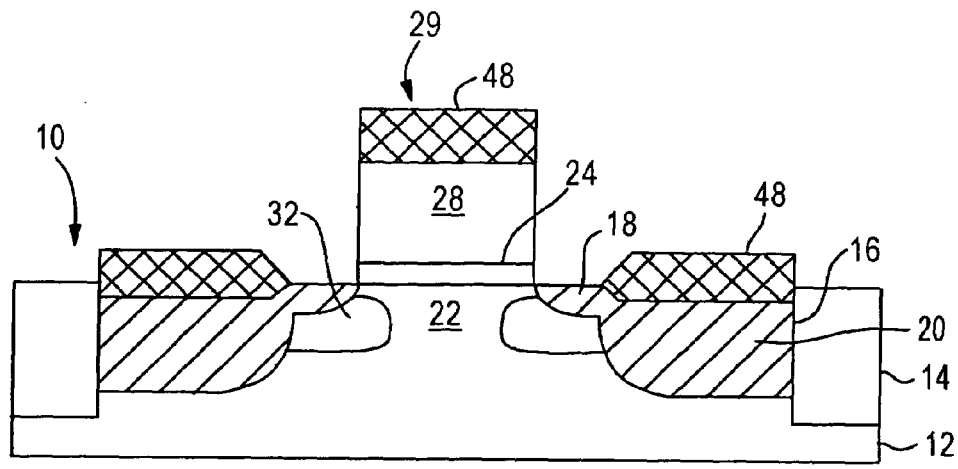
Figure 16:
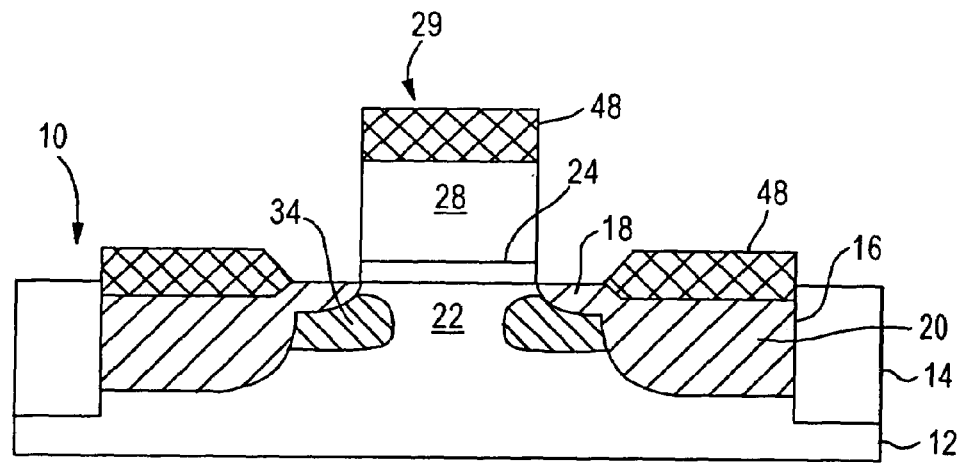
Figure 17:
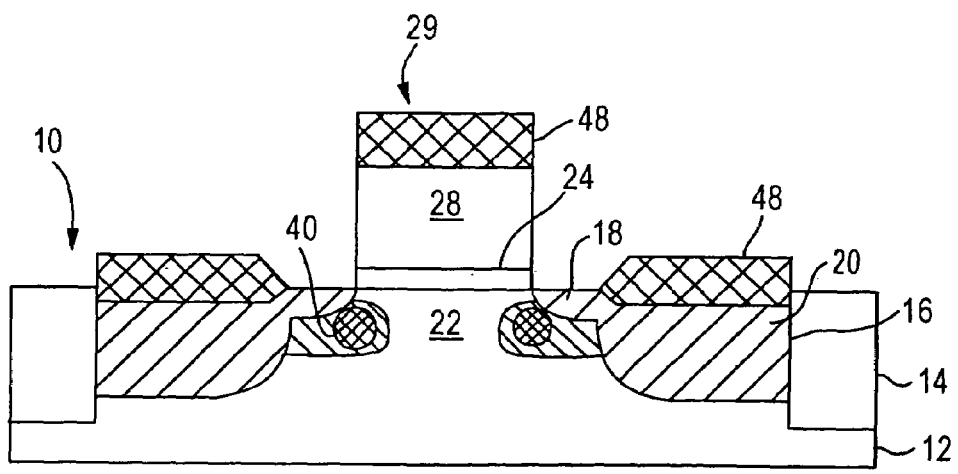
Figure 18:
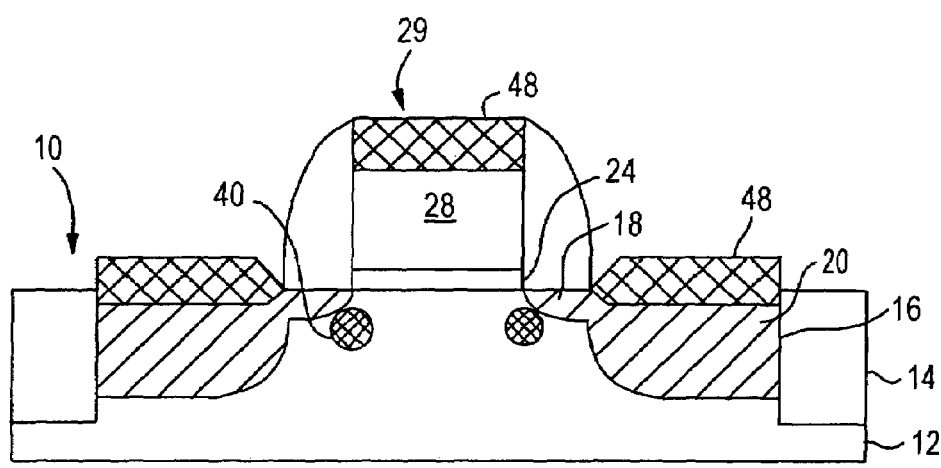

Highly localized halo implant regions can be formed by an alternative method according to another embodiment of the instant invention. A semiconductor device 10 is formed with metal silicide contacts 48 prior to forming the highly localized halo implant regions 40. As shown in FIG. 13, a semiconductor device 10 with metal silicide contacts 48 on the gate electrode 28 and source/drain regions 16 is provided. The sidewall spacers 44 are removed, such as by etching with an appropriate etchant, as shown in FIG. 14. As shown in FIG. 15, amorphous regions 32 are subsequently formed in the channel region 22 by a PAI process as explained in the previous embodiment (e.g. —implantation of electrically neutral dopant). A halo implant is subsequently performed to form halo implant regions 34, as shown in FIG. 16. Localized portions of the halo implant regions 34 are activated by an LTA method, as discussed in the previous embodiment, to produce activated halo implant regions 40, as shown in FIG. 17. Sidewall spacers 50 can optionally be formed on the semiconductor device 10, as shown in FIG. 18. In FIG. 18 only the activated portion of the halo implant region 40 is illustrated. The sidewall spacers 50 can be formed by a conventional self-alignment process comprising the deposition of an insulating layer followed by anisotropic etching.

The embodiments illustrated in the instant disclosure are for illustrative purposes only. They should not be construed to limit the claims. As is clear to one of ordinary skill in the art, the instant disclosure encompasses a wide variety of embodiments not specifically illustrated herein.

What is claimed is:

1. A method of forming a semiconductor device comprising the sequential steps of:
    providing a silicon-containing semiconductor substrate with a gate electrode structure formed on the semiconductor substrate;
    implanting N-type or P-type dopant into the silicon-containing semiconductor substrate to form source and drain regions and define a channel region between said source and drain regions, wherein said channel region underlies said gate electrode;
    implanting an electrically neutral dopant into the channel region of the silicon-containing substrate adjacent a boundary of the source and drain regions and the channel region to form an amorphized region;
    implanting dopant of a first conductivity type into the amorphized region; and
    activating a portion of the amorphized region.

2. The method according to claim 1, wherein said step of implanting dopant of a first conductivity type is a halo implant.

3. The method according to claim 2, wherein the electrically neutral dopant and the dopant of a first conductivity type are implanted into the substrate at an angle of about 15° to about 45° to a vertical axis.

4. The method according to claim 1, wherein said step of activating a portion of the amorphized region comprises laser thermal annealing a portion of the amorphized region.

5. The method according to claim 1, wherein said step of providing a semiconductor substrate comprises:
    providing a silicon-containing substrate;
    forming a gate electrode structure comprising a gate insulating layer and gate electrode layer on said substrate, and wherein forming said source and drain regions comprises:
    implanting dopant of the second conductivity type in said substrate to form source and drain extensions;
    forming sidewall spacers alongside the gate electrode structure; and
    implanting dopant of the second conductivity type in said substrate to form source and drain regions.

6. The method according to claim 5, further comprising depositing a metal layer over the semiconductor substrate after forming the source and drain regions;
    heating the metal layer so that metal in the metal layer reacts with silicon in the silicon-containing substrate and gate electrode structure to form a metal silicide layer; and
    removing unreacted metal.

7. The method according to claim 5, further comprising removing the sidewall spacers prior to said step of implanting electrically neutral dopant.

8. The method according to claim 7, further comprising depositing an insulating layer over the semiconductor substrate after said step of activating a portion of the amorphized layer;
    anisotropically etching the insulating layer to form gate electrode sidewall spacers;
    depositing a metal layer over the semiconductor substrate;
    heating the metal layer so that metal in the metal layer reacts with silicon in the silicon-containing substrate and gate electrode structure to form a metal silicide layer; and
    removing unreacted metal.

9. The method according to claim 5, further comprising thermally annealing the semiconductor substrate to activate the source/drain regions.

10. The method according to claim 3, wherein the implantation of the electrically neutral dopant and the dopant of a first conductivity type is performed by rotary implantation.

11. The method according to claim 3, wherein the implantation of the electrically neutral dopant comprises first implanting electrically neutral dopant on one side of the gate electrode structure and then implanting electrically neutral dopant on an opposing side of the gate electrode structure, and implantation of the dopant of a first conductivity type comprises first implanting dopant of a first conductivity type on one side of the gate electrode and then implanting dopant of a first conductivity type on an opposing side of the gate electrode.

12. The method according to claim 1, wherein said electrically neutral dopant is selected from the group consisting of Si, Ge, Ar, and Xe.

13. The method according to claim 12, wherein said electrically neutral dopant is implanted at an implantation dosage of about $1 \times 10^{14}$ ions/cm$^2$ to about $1 \times 10^{16}$ ions/cm$^2$ and an implantation energy of about 1 keV to about 100 keV.

14. The method according to claim 13, wherein said electrically neutral dopant is implanted at an implantation dosage of about $5 \times 10^{15}$ ions/cm$^2$ to about $1 \times 10^{16}$ ions/cm$^2$ and an implantation energy of about 10 keV to about 50 keV.

15. The method according to claim 4, wherein the wavelength of the laser is between about 150 nm and about 310 nm and the laser fluence is about 0.1 J/cm$^2$ to about 1.5 J/cm$^2$.

16. The method according to claim 5, wherein said semiconductor device is a NMOSFET and the dopant implanted into the source/drain regions and the source/drain extensions is arsenic and the dopant of said first conductivity type is boron.

17. The method according to claim 16, wherein the arsenic is implanted into the source/drain extensions at an implantation dosage of about $1 \times 10^{14}$ ions/cm$^2$ to about $1 \times 10^{15}$ ions/cm$^2$ and an implantation energy of about 2 keV to about 5 keV, the arsenic is implanted into the source/drain regions at an implantation dosage of about $1 \times 10^{15}$ ions/cm$^2$ to about $4 \times 10^{15}$ ions/cm$^2$ and an implantation energy of about 20 keV to about 50 keV, and the boron is implanted into the amorphized region at an implantation dosage of about $8 \times 10^{12}$ ions/cm$^2$ to about $5 \times 10^{13}$ ions/cm$^2$ and an implantation energy of about 7 keV to about 15 keV.

18. The method according to claim 5, wherein said semiconductor device is a PMOSFET and the dopant implanted into the source/drain extensions is boron difluoride, the dopant implanted into the source/drain regions is boron, and the dopant of said first conductivity type is arsenic.

19. The method according to claim 18, wherein the boron difluoride is implanted into the source/drain extensions at an implantation dosage of about $1 \times 10^{14}$ ions/cm$^2$ to about $1 \times 10^{15}$ ions/cm$^2$ and an implantation energy of about 2 keV to about 5 keV, the boron is implanted into the source/drain regions at an implantation dosage of about $1 \times 10^{15}$ ions/cm$^2$ to about $4 \times 10^{15}$ ions/cm$^2$ and an implantation energy of about 2 keV to about 10 keV, and the arsenic is implanted into the amorphized region at an implantation dosage of about $8 \times 10^{12}$ ions/cm$^2$ to about $5 \times 10^{13}$ ions/cm$^2$ and an implantation energy of about 30 keV to about 50 keV.

\* \* \* \* \*